United States Patent
Lin et al.

(10) Patent No.: US 6,433,284 B1
(45) Date of Patent: Aug. 13, 2002

(54) PARTIALLY CUT MULTI-PLANAR FLEXIBLE PRINTED CIRCUIT

(75) Inventors: Gwun-Jin Lin; Chi-Kuang Hwang; Ching-Cheng Tien, all of Taoyuan (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 0 days.

(21) Appl. No.: 09/749,030

(22) Filed: Dec. 26, 2000

(30) Foreign Application Priority Data

Jul. 25, 2000 (TW) ......................................... 89114873 A

(51) Int. Cl.⁷ ................................................. H05K 1/03
(52) U.S. Cl. ........................ 174/254; 174/255; 361/749; 361/751
(58) Field of Search ................................ 174/254, 255; 361/749, 750, 751, 780, 794, 795, 792, 793

(56) References Cited

U.S. PATENT DOCUMENTS 6,288,343 B1 * 9/2001 Ahn et al. .................. 174/254

* cited by examiner

Primary Examiner—Albert W. Paladini

(57) ABSTRACT

A partially cut multi-planar flexible printed circuit comprises a substrate, a set of signal conducting elements for differential mode and common mode, a power supply and/or ground. The multi-planar flexible printed circuit is formed by partially grouped cutting a flexible printed circuit at a proper position so that the cross-sectional area of the multi-planar flexible printed circuit at the cut portion can fit in with a small round or square splice hole in addition to a flat rectangular slit for connecting, for example, a liquid crystal display with a notebook computer. Moreover, intervals between edges of a substrate and a plurality of transmission lines are preferably greater than three times of thickness of the substrate.

5 Claims, 2 Drawing Sheets

PARTIALLY CUT MULTI-PLANAR FLEXIBLE PRINTED CIRCUIT

BACKGROUND OF THE INVENTION

1. Field of the Invention

The present invention relates generally to flexible printed circuits, more specifically, it relates to an impedance controlled flexible printed circuit with differential mode transmission lines for high-speed data transmission.

2. Description of the Prior Art

Flexible printed circuits have been widely used in high price notebook computers for connecting the liquid crystal display (LCD) to the main system. Low Voltage differential signals (LVDS) structure has been implemented for high transmission data rate for reducing the power consumption and noise interference. A serious competition comes from micro coaxial cables because of the short prototype producing time, thus, some models of notebook computers have been implemented with micro coaxial cables instead of flexible printed circuits. The micro coaxial cables are not suitable for a bending mode, so the outfit of the main system for cable to penetrate through has been changed from a flat rectangle to a small round or square hole. This change has modified the bending mode to a torsion mode, and it can improve the suitability of the micro coaxial cables. However, the micro coaxial cables lack mass production ability and have low yielding rate as well as low temperature sustaining ability, so some engineers try to switch back from the micro coaxial cables to the flexible printed circuits. But a small round or square hole is no longer suitable for the flexible printed circuits.

SUMMARY OF THE INVENTION

This invention has been aimed to solve the above mentioned problem of fitting a planar flexible printed circuit in a non-flat structure constraint so that its application can be more prevalent. The main object of this invention is to convert a planar flexible printed circuit to a multi-planar flexible printed circuit structure. Accordingly, the multi-planar flexible circuit can be better fit in a non-rectangular structure such as a small round or square hole.

Another object of this invention is to form a multi-planar flexible printed circuit in which the impedance of transmission lines can be better controlled. In the present invention, the flexible printed circuit comprises a multi-planar structure including layers of signal conducting elements for differential mode, common mode, power, and/or ground. Transmission lines are organized as groups based on their characteristics. An area containing a pair of signal conducting elements is cut together to form a group in a same layer. Therefore, the impedance of the transmission lines can be controlled.

Other features and advantages of the present invention will become apparent from the following description which refers to the accompanying drawings.

Figure 1:
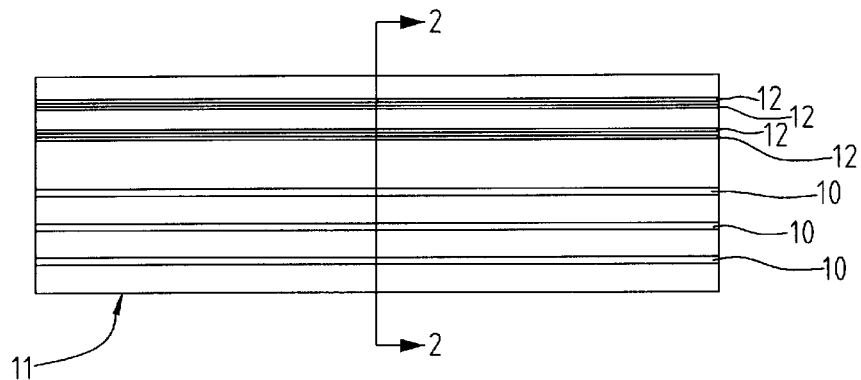
FIG. 1 depicts a plan view of a flexible printed circuit before grouped cutting.

REFERENCED PARAMETERS IN THE DRAWINGS:

10 Signal conducting elements for common mode, power, and/or ground.
11 flexible printed circuits
12 Signal conducting elements for differential mode
14 Cutting out area

DETAILED DESCRIPTION OF THE PREFERRED EMBODIMENT

Structural constraints such as a small round or a square hole are suitable for micro coaxial cables, but they normally are unsuitable for flexible printed circuits. This invention is to convert flexible printed circuits from a planar structure to a multi-planar structure in order for flexible printed circuits to fit in structure constraint such as a small round hole or a small square hole that is not flat rectangular.

Figure 2:
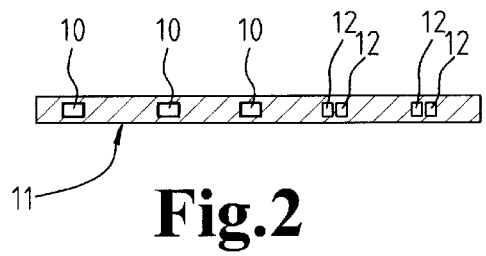
FIG. 2 depicts a cross-sectional elevational view of the flexible printed circuit before grouped cutting taken along the line 2—2 in FIG. 1.
Figure 3:
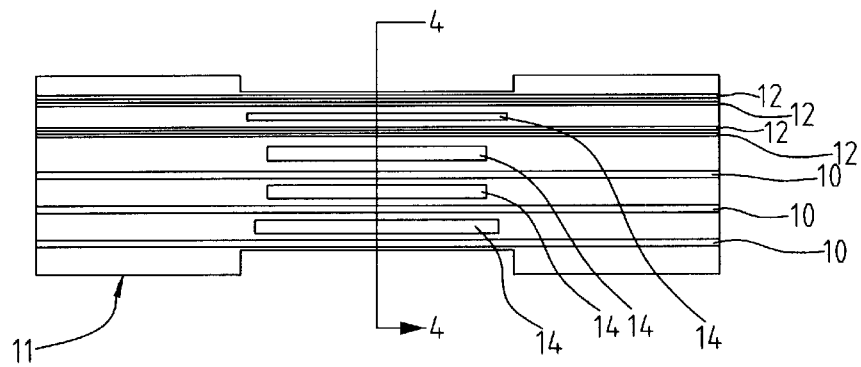
FIG. 3 depicts a plan view of a flexible printed circuit after grouped cutting
Figure 4:
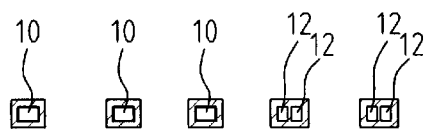
FIG. 4 depicts a cross-sectional elevational view of the flexible printed circuit after grouped cutting taken along the line 4—4 in FIG. 3.
Figure 5:
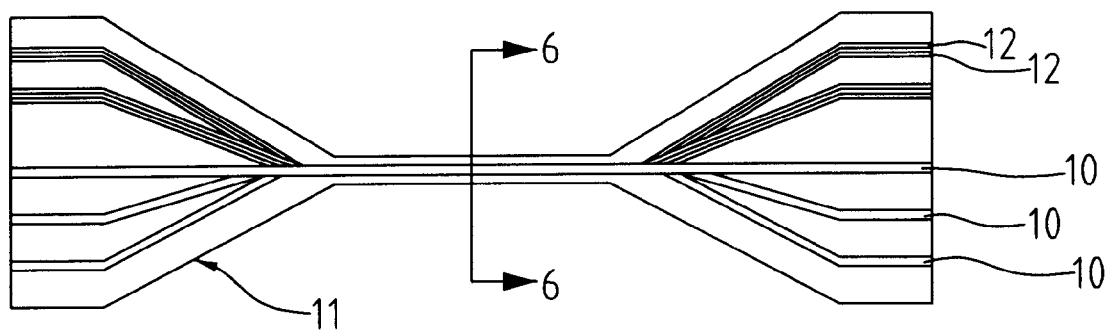
FIG. 5 depicts a plan view of a flexible printed circuit after grouped cutting and conversion from a planar structure to a multi-planar structure.
Figure 6:
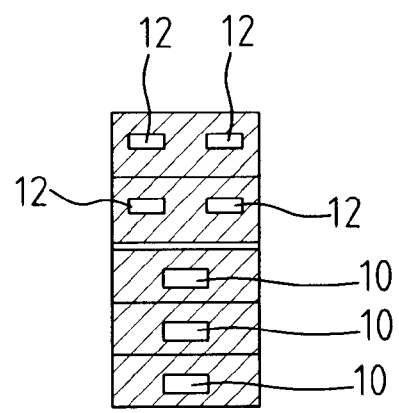
FIG. 6 depicts a cross-sectional elevational view of the flexible printed circuit after grouped cutting and conversion from a planar structure to a multi-planar structure taken along the line 6—6 in FIG. 5.

A flexible printed circuit (11) before grouped cutting is presented in FIG. 1, and it contains signal conducting elements for differential mode (12), common mode, power, and/or ground (10). Some flexible printed circuits may have shielding planes, but these shielding planes are omitted for simplifying the drawings. FIG. 2 shows a cross-sectional elevational view of the flexible printed circuit before grouped cutting taken along the line 2—2 in FIG. 1. In FIG. 3, grouped cutting has been performed in the middle of the flexible printed circuits. Signal conducting elements for differential mode are grouped in the same layer (12) as shown in FIG. 3 and FIG. 4, and the virtual ground is generated between them. A cross-sectional elevational view of the flexible printed circuit after grouped cutting taken along the line 4—4 in FIG. 3 is depicted in FIG. 4. FIG. 5 depicts a plan view of the flexible printed circuit after conversion from a planar structure to a multi-planar structure, and FIG. 6 depicts a cross-sectional elevational view of it taken along the line 66 in FIG. 5.

The grouped cutting based on the characteristics of the transmission lines is more suitable for impedance controlled differential mode transmission lines with flexible printed circuits as compared with micro coaxial cables. For differential mode transmission lines, the pairs of the differential mode had better be kept in the same layer to have the virtual ground for controlling impedance, however, this is not true for micro coaxial cables because of the shielding surfaces surrounding the micro coaxial cables. That is, two micro coaxial cables are needed for the differential mode, but there is a real ground between them formed by their shielding surfaces and it is undesired for the differential mode.

The width of the group after cutting is supposed to be as small as possible for smaller physical size. But, for the sake of impedance control and electromagnetic interference of flexible printed circuits, the intervals between the edges of a substrate to the most left or right edges of transmission lines are preferably to be larger than three times of the thickness of substrates.

Although only the preferred embodiments of this invention were shown and described in the above description, it is requested that any modification or combination that come within the spirit of this invention be protected.

What is claimed is:

1. A partially cut multi-planar flexible printed circuit comprising:
    a first set of substrate portions in which each portion includes at least a pair of differential mode signal conducting elements;
    wherein said first set of substrate portions are stacked up to form a multi-planar structure.

2. The partially cut multi-planar flexible printed circuit as claimed in claim 1 further comprising:
    a second set of substrate portions in which each portion includes at least a common mode signal conducting element;
    a third set of substrate portions in which each portion includes at least a power conducting element; and
    a fourth set of substrate portions in which each portion includes at least a ground conducting element;
    wherein said first, second, third and fourth sets of substrate portions are stacked up to form a multi-planar structure.

3. The partially cut multi-planar flexible printed circuit as claimed in claim 2, said partially cut multi-planar flexible printed circuit being converted from a planar flexible printed circuit, and said first, second, third and fourth sets of substrate portions being partially cut from a substrate of said planar flexible printed circuit.

4. The partially cut multi-planar flexible printed circuit as claimed in claim 1, wherein said at least a pair of differential mode signal conducting elements form a pair of transmission lines with a virtual ground in between.

5. The partially cut multi-planar flexible printed circuit as claimed in claim 1, wherein the distance between a differential mode signal conducting element to a nearest side edge of said first set of substrate portions is at least three times the thickness of said first set of substrate portions.

* * * * *